(12) United States Patent
Takeda et al.

(10) Patent No.: US 10,230,003 B2
(45) Date of Patent: Mar. 12, 2019

(54) METHOD OF EVALUATING THIN-FILM TRANSISTOR, METHOD OF MANUFACTURING THIN-FILM TRANSISTOR, AND THIN-FILM TRANSISTOR

(71) Applicant: JOLED INC., Tokyo (JP)

(72) Inventors: Eiji Takeda, Osaka (JP); Toru Saito, Tokyo (JP)

(73) Assignee: JOLED INC., Tokyo (JP)

( * ) Notice: Subject to any disclaimer, the term of this patent is extended or adjusted under 35 U.S.C. 154(b) by 520 days.

(21) Appl. No.: 14/915,704

(22) PCT Filed: Jun. 25, 2014

(86) PCT No.: PCT/JP2014/003395
§ 371 (c)(1),
(2) Date: Mar. 1, 2016

(87) PCT Pub. No.: WO2015/033499
PCT Pub. Date: Mar. 12, 2015

(65) Prior Publication Data
US 2016/0197198 A1 Jul. 7, 2016

(30) Foreign Application Priority Data
Sep. 3, 2013 (JP) .................................. 2013-182256

(51) Int. Cl.
*G01R 27/04* (2006.01)
*H01L 29/786* (2006.01)
(Continued)

(52) U.S. Cl.
CPC .... *H01L 29/78693* (2013.01); *G01R 31/2621* (2013.01); *G01R 31/2642* (2013.01);
(Continued)

(58) Field of Classification Search
CPC ............ G01R 31/2621; G01R 31/2642; G01R 31/2656; H01L 29/78693; H01L 29/78696;
(Continued)

(56) References Cited

U.S. PATENT DOCUMENTS 5,883,437 A * 3/1999 Maruyama ........ G02F 1/136286
257/529
6,653,850 B2 * 11/2003 Pavelka ............. G01R 31/2648
324/719
(Continued)

FOREIGN PATENT DOCUMENTS

JP 2008-177476 7/2008
JP 2012-028751 2/2012
(Continued)

OTHER PUBLICATIONS

International Search Report issued in PCT/JP2014/003395, dated Sep. 16, 2014.

*Primary Examiner* — Thang X Le
(74) *Attorney, Agent, or Firm* — Greenblum & Bernstein, P.L.C.

(57) ABSTRACT

A method of evaluating a thin-film transistor (TFT) which is disposed on a substrate, and includes at least: an oxide semiconductor layer which functions as a channel layer; and a channel protection layer disposed above the oxide semiconductor layer. The method includes: measuring a change in a reflectance of a microwave emitted to the oxide semiconductor layer while the oxide semiconductor layer is irradiated with excitation light by pulse irradiation; calculating a decay period which is a period of time taken for the reflectance to decay to 1/e or $1/e^2$, based on the change in the reflectance obtained in the measuring; and performing determination related to a threshold voltage of the oxide semi- (Continued)

conductor layer, based on the decay period calculated in the calculating.

19 Claims, 12 Drawing Sheets

(51) Int. Cl.
   *H01L 21/66* (2006.01)
   *G01R 31/26* (2014.01)
   *G01R 31/265* (2006.01)
   *H01L 21/477* (2006.01)
   *H01L 29/24* (2006.01)
   *H01L 29/66* (2006.01)
   *H01L 21/02* (2006.01)

(52) U.S. Cl.
   CPC ........ *G01R 31/2656* (2013.01); *H01L 21/477* (2013.01); *H01L 22/14* (2013.01); *H01L 29/247* (2013.01); *H01L 29/66969* (2013.01); *H01L 29/78606* (2013.01); *H01L 29/78696* (2013.01); *H01L 21/02554* (2013.01); *H01L 21/02565* (2013.01); *H01L 21/02631* (2013.01)

(58) Field of Classification Search
   CPC ............. H01L 29/78606; H01L 29/247; H01L 29/66969; H01L 21/477; H01L 21/02565; H01L 21/02554; H01L 21/02631; H01L 27/146
   See application file for complete search history.

(56) References Cited

U.S. PATENT DOCUMENTS

| | | | |
|---|---|---|---|
| 6,693,286 B2* | 2/2004 | Hasegawa | G01N 21/6408 250/458.1 |
| 7,560,700 B2* | 7/2009 | Imai | G01T 1/24 250/370.08 |
| 8,853,683 B2 | 10/2014 | Miyanaga et al. | |
| 8,895,976 B2 | 11/2014 | Tsubuku et al. | |
| 8,952,338 B2 | 2/2015 | Sakoda et al. | |
| 9,261,609 B2* | 2/2016 | Shahar | G01T 1/247 |
| 2011/0147736 A1 | 6/2011 | Miyanaga et al. | |
| 2011/0315979 A1 | 12/2011 | Tsubuku et al. | |
| 2013/0153778 A1* | 6/2013 | Sakoda | G01N 21/63 250/393 |
| 2015/0014684 A1* | 1/2015 | Miyanaga | H01L 29/66742 257/43 |
| 2015/0069393 A1 | 3/2015 | Tsubuku et al. | |

FOREIGN PATENT DOCUMENTS

| | | |
|---|---|---|
| JP | 2012-033857 | 2/2012 |
| JP | 2013-030542 | 2/2013 |
| JP | 2013-102197 | 5/2013 |
| WO | 2012/039099 | 3/2012 |

\* cited by examiner

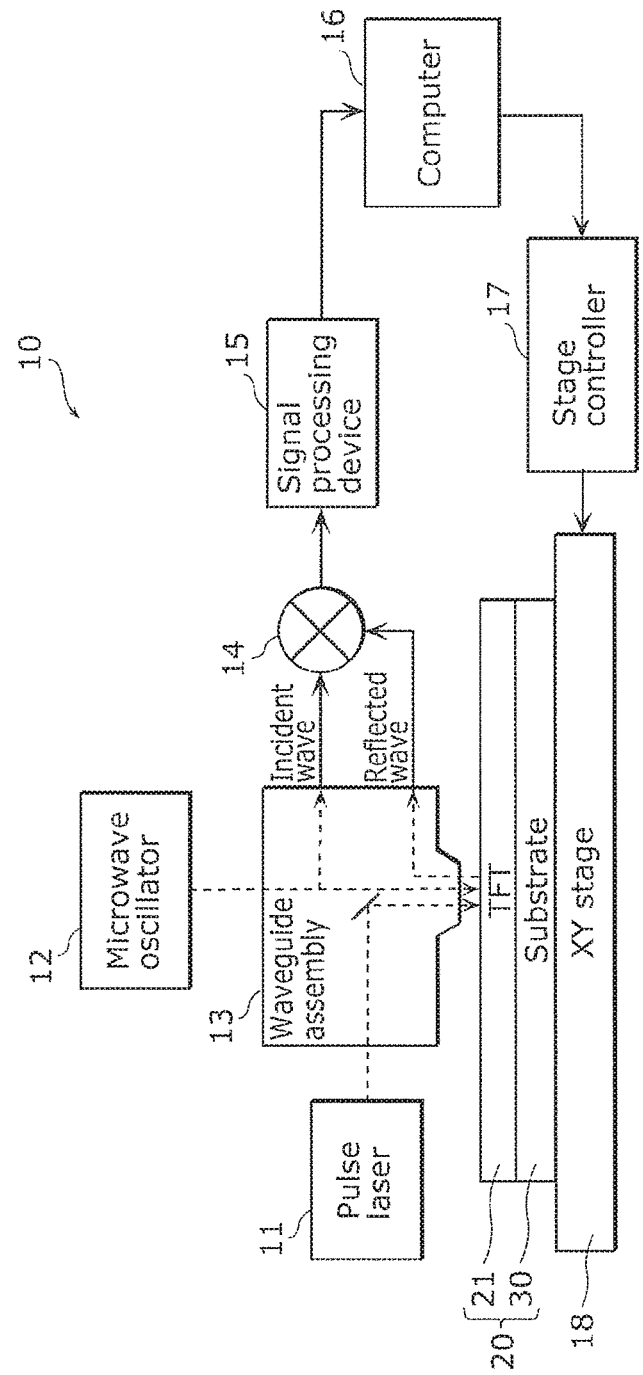

FIG. 9A
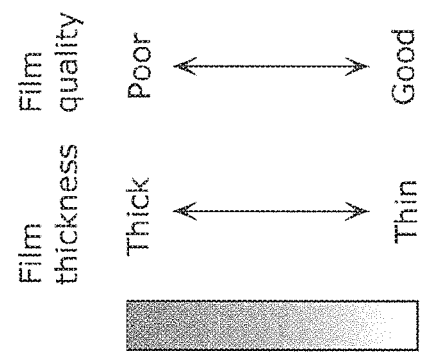
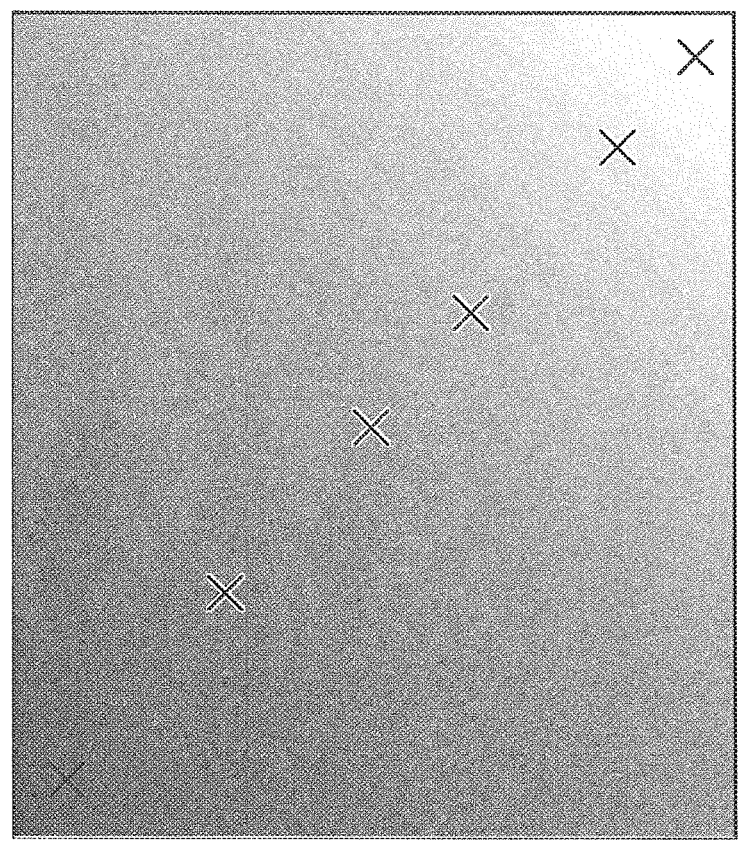

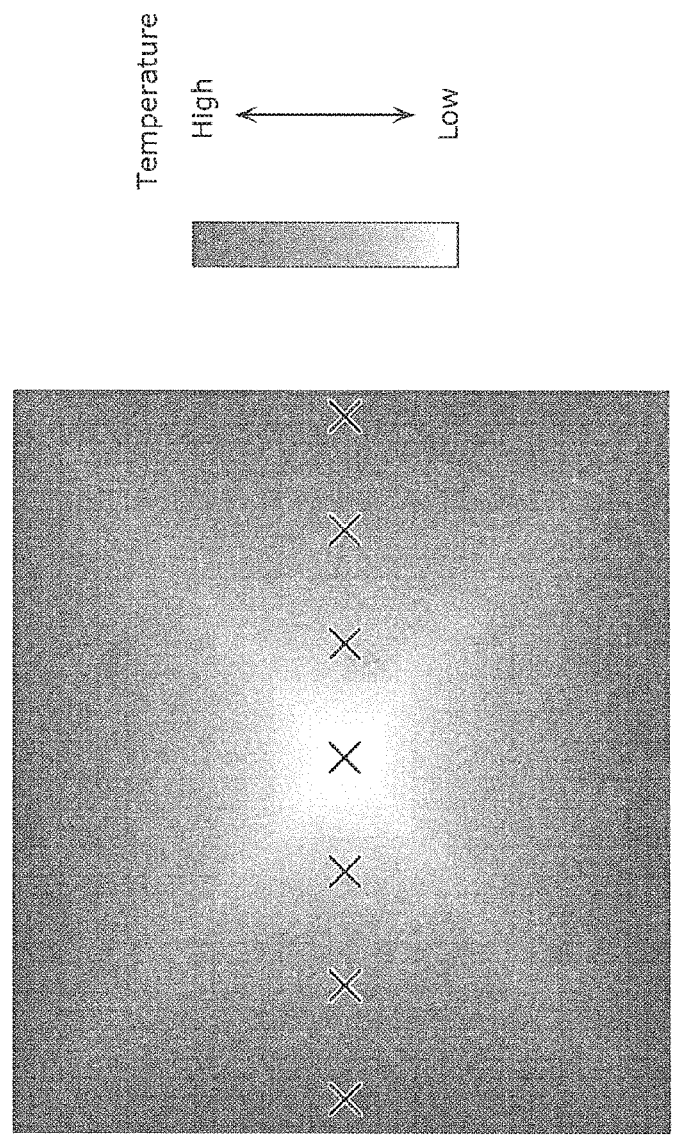

METHOD OF EVALUATING THIN-FILM TRANSISTOR, METHOD OF MANUFACTURING THIN-FILM TRANSISTOR, AND THIN-FILM TRANSISTOR

TECHNICAL FIELD

The present disclosure relates to a method of evaluating a thin-film transistor including an oxide semiconductor layer, a method of manufacturing the thin-film transistor, and the thin-film transistor. The present disclosure particularly relates to a method of evaluating the thin-film transistor using a microwave photoconductive decay method.

BACKGROUND ART

An oxide semiconductor typified by amorphous IGZO (In—Ga—Zn—O) has a high carrier mobility, can be manufactured at room temperature, and has a large optical band gap (i.e., has transparency to visible light), and thus application of the oxide semiconductor to a thin-film transistor (hereinafter also referred to as a TFT) or the like, such as a driving element of an active-matrix display such as an organic electroluminescent (EL) display has been examined.

As a method of evaluating such an oxide semiconductor, conventionally, there has been a proposed technique of determining mobility using a microwave photoconductivity decay (μ-PCD) method (see Patent Literature (PTL) 1, for example).

With a microwave photoconductive decay method disclosed by PTL 1, a sample on which an oxide semiconductor thin film is formed is irradiated with excitation light and a microwave. After the maximum value of a reflected wave of a microwave from the oxide semiconductor thin film which is changed by the irradiation of the excitation light is measured, the irradiation of the excitation light is stopped. The change in reflectance of the reflected wave of the microwave from the oxide semiconductor thin film after the stop of the irradiation of the exciting light is measured. A lifetime value is calculated from the measured value, and thereby mobility of the oxide semiconductor thin film is determined. With the above-described technique, a non-contact evaluation and measurement of mobility of the oxide semiconductor thin film is implemented.

CITATION LIST

Patent Literature
[PTL 1] Japanese Unexamined Patent Application Publication No. 2012-33857
[PTL 1]

SUMMARY OF INVENTION

Technical Problem

The evaluation method of PTL 1, however, is for evaluation targeting a sample including a substrate on which only an oxide semiconductor thin film is formed, and not for evaluation of a TFT including an oxide semiconductor layer as a channel layer (hereinafter also referred to as an "oxide semiconductor TFT"); that is, an evaluation in a manufacturing process of the oxide semiconductor TFT.

In manufacturing an oxide semiconductor TFT, the physical property of an oxide semiconductor may possibly change significantly even in a manufacturing process subsequent to depositing of the oxide semiconductor thin film. Before and after (i) stabilizing annealing after forming a channel protection layer above the oxide semiconductor layer, and (ii) stabilizing annealing after forming an interlayer insulating layer above source and drain electrodes, in particular, variations or the like in the electrical characteristics might possibly occur depending on a position of forming the oxide semiconductor above the substrate, due to unevenness of temperature distributions or the like in the annealing. Thus, conventional evaluation methods targeting a sample on which only the oxide semiconductor thin film is formed are not sufficient for the evaluation targeting the oxide semiconductor TFT.

The present disclosure has been conceived in view of the above-described circumstances, and an object of the present disclosure is to provide a method of evaluating electrical characteristics in a non-contact manner targeting the oxide semiconductor TFT, and the like.

Solution to Problem

In order to achieve the above object, a method of evaluating a thin-film transistor according to one aspect of the present disclosure is a method of evaluating a thin-film transistor which is disposed on a substrate, and includes at least: an oxide semiconductor layer which functions as a channel layer; and a channel protection layer disposed above the oxide semiconductor layer, the method including: measuring a change in a reflectance of a microwave emitted to the oxide semiconductor layer while the oxide semiconductor layer is irradiated with excitation light by pulse irradiation; calculating a decay period which is a period of time taken for the reflectance to decay from a first value to a second value, based on the change in the reflectance obtained in the measuring; and performing determination related to a threshold voltage of the oxide semiconductor layer, based on the decay period calculated in the calculating.

Advantageous Effects of Invention

The present disclosure enables evaluation of electrical characteristics targeting not an oxide semiconductor thin film alone, but an oxide semiconductor TFT that is applied to a driving element or the like included in an active-matrix display.

It is therefore possible to incorporate the evaluation method according to the present disclosure into manufacturing processes of the oxide semiconductor TFT (high-volume manufacturing processes of display panels, etc.), and thus the practical value of the present disclosure is significantly high in these times in which development of active-matrix display panels such as organic EL displays has high future development potential.

BRIEF DESCRIPTION OF DRAWINGS

FIG. 1A is a block diagram illustrating a configuration of a measuring device which performs a method of evaluating a TFT according to an embodiment of the present disclosure.

FIG. 9A is a diagram illustrating an example of positioning a measurement position, which depends on a film thickness and/or film quality of the oxide semiconductor layer.

FIG. 9B is a diagram illustrating an example of positioning a measurement position, which depends on a temperature distribution in an annealing treatment.

DESCRIPTION OF EMBODIMENTS

Outline of the Present Disclosure

Figure 1B:
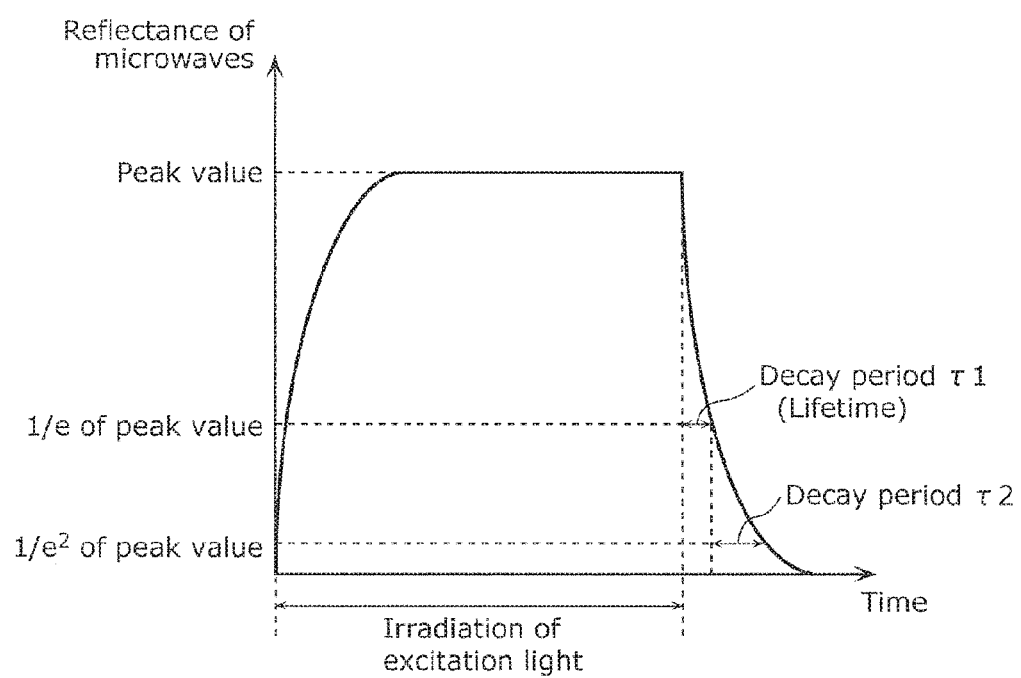
FIG. 1B is a diagram illustrating time variation of reflectance of a microwave obtained by the measuring device illustrated in FIG. 1A.

A method of evaluating a thin-film transistor according to the present disclosure is, as an evaluation of a threshold voltage, a method of evaluating a thin-film transistor which is formed on a substrate and includes at least: an oxide semiconductor layer which functions as a channel layer; and a channel protection layer disposed above the oxide semiconductor layer, the method including: measuring a change in a reflectance of a microwave emitted to the oxide semiconductor layer while the oxide semiconductor layer is irradiated with excitation light by pulse irradiation; calculating a decay period which is a period of time taken for the reflectance to decay from a first value to a second value, based on the change in the reflectance obtained in the measuring; and performing determination related to a threshold voltage of the oxide semiconductor layer, based on the decay period calculated in the calculating. With this, it is possible to determine a threshold voltage of the oxide semiconductor layer by performing, not on an oxide semiconductor thin film alone but on an oxide semiconductor TFT including a channel protection layer and an intermediate thereof, a non-contact measurement by a microwave photoconductivity decay method. It is thus possible to manage the film quality of an oxide semiconductor layer in the manufacturing process, by incorporating the evaluation process described above into a manufacturing process of the oxide semiconductor TFT (i.e., a high-volume manufacturing process of display panels, etc).

It should be noted that, the decay period is, for example, at least one of a period of time taken for the reflectance to decay from a peak value to $1/e$ of the peak value, a period of time taken for the reflectance to decay from $1/e$ of the peak value to $1/e^2$ of the peak value, and a period of time taken for the reflectance to decay from the peak value to $1/e^2$ of the peak value, e being a base of natural logarithm.

Here, the determination related to the threshold voltage may be at least one of identification of the threshold voltage and determination of whether or not the threshold voltage falls within a predetermined range. With this, it is possible to calculate a threshold voltage of an oxide semiconductor layer, and determine whether the oxide semiconductor TFT is a non-defective product or a defective product based on the threshold voltage.

In addition, in the performing of determination, the threshold voltage of the oxide semiconductor layer corresponding to the decay period calculated in the calculating may be identified by referring to a pre-calculated relation between a decay period and a threshold voltage. With this, based on a decay period obtained by measurement, a threshold voltage of an unknown oxide semiconductor layer is determined, using a pre-calculated relation between a decay period and a threshold voltage.

In addition, the method of evaluating a thin-film transistor according to the present disclosure is a method of evaluating a thin-film transistor which is formed on a substrate and which includes at least: an oxide semiconductor layer which functions as a channel layer; and a channel protection layer disposed above the oxide semiconductor layer, the method including: measuring a change in a reflectance of a microwave emitted to the oxide semiconductor layer while the oxide semiconductor layer is irradiated with excitation light by pulse irradiation; calculating at least one of a decay period which is a period of time taken for the reflectance to decay from a first value to a second value, and a peak value of the reflectance, based on the change in the reflectance obtained in the measuring; and performing determination related to a resistance value of the oxide semiconductor layer, based on the decay period or the peak value calculated in the calculating. With this, it is possible to determine a resistance value of the oxide semiconductor layer by performing, not on an oxide semiconductor thin film alone but on an oxide semiconductor TFT including a channel protection layer and an intermediate thereof, a non-contact measurement by the microwave photoconductivity decay method. It is thus possible to manage the film quality of an oxide semiconductor layer in the manufacturing process, by incorporating the evaluation process described above into a manufacturing process of the oxide semiconductor TFT (i.e., a high-volume manufacturing process of display panels, etc).

It should be noted that the decay period is, for example, at least one of a period of time taken for the reflectance to decay from a peak value to $1/e$ of the peak value, a period of time taken for the reflectance to decay from $1/e$ of the peak value to $1/e^2$ of the peak value, and a period of time required for the reflectance to decay from the peak value to $1/e^2$ of the peak value, e being a base of natural logarithm.

Here, the determination related to the resistance value may be at least one of identification of the resistance value and determination of whether or not the resistance value falls within a predetermined range. With this, it is possible to calculate a resistance value of an oxide semiconductor layer, and determine whether the oxide semiconductor TFT is a non-defective product or a defective product based on the resistance value.

In addition, in the performing of determination, the resistance value of the oxide semiconductor layer corresponding to the at least one of the decay period and the peak value calculated in the calculating may be identified by referring to a pre-calculated relation between a decay period or peak value and a resistance value. With this, based on a decay period or a peak value obtained by measurement, a resistance value of an unknown oxide semiconductor layer is determined, using a pre-calculated relation between a decay period or a peak value and a threshold voltage.

It should be noted that the thin-film transistor may be subjected to a first annealing treatment after forming of the channel protection layer, the first annealing treatment being for stabilizing the channel protection layer, and the measuring may be performed subsequent to the first annealing treatment. With this, it is possible to check whether or not electrical characteristics of an oxide semiconductor layer are changed due to an annealing treatment that is highly likely to change a physical property of an oxide semiconductor, and further check a degree of change in the electrical characteristics.

In addition, the thin-film transistor may further include a source electrode and a drain electrode which are disposed above the channel protection layer, and an interlayer insulating layer disposed above the source electrode and the drain electrode, and the measuring may be performed after forming of the interlayer insulating layer. With this, it is possible to determine electrical characteristics of an oxide semiconductor layer by performing a non-contact measurement by the microwave photoconductivity decay method on an oxide semiconductor TFT including not only a channel protection layer but also an interlayer insulating layer.

In addition, the thin-film transistor may be subjected to a second annealing treatment after forming of the interlayer insulating layer, the second annealing treatment being for stabilizing the interlayer insulating layer, and the measuring may be performed subsequent to the second annealing treatment. With this, it is possible to evaluate electrical characteristics of an oxide semiconductor TFT at the time when the last stage of manufacturing processes is completed.

In addition, the method of evaluating a thin-film transistor may further include positioning a measurement position to change a target position of the measurement performed in the measuring, wherein the measuring, the calculating, and the performing of determination may be performed on the target position changed in the positioning. With this, it is possible to perform quality control of a panel as a whole, by performing a measurement, calculating a parameter, and determining electrical characteristics at multiple planar positions while sequentially changing a position.

More specifically, the oxide semiconductor layer may be formed by a sputtering method targeting a plurality of strip regions arranged at regular intervals on the substrate, and in the positioning, the target position of the measurement may be changed to perform the measurement in the measuring on each of the plurality of strip regions and each of regions between adjacent ones of the strip regions. With this, it is possible to evaluate a change, variation, etc., in electrical characteristics of an oxide semiconductor layer, depending on a position of the sputtering target.

As another specific example, the target position of measurement may include a plurality of target positions of measurement, and the target position may be sequentially changed among the plurality of target positions in the positioning, the plurality of target positions being arranged according to a tendency of at least one of (i) an increasing film thickness of the oxide semiconductor layer, (ii) a decreasing film thickness of the oxide semiconductor layer, (iii) a deteriorating film quality of the oxide semiconductor layer, and (iv) an improving film quality of the oxide semiconductor layer. With this, it is possible to evaluate a change, variation, etc., in electrical characteristics of an oxide semiconductor layer depending on a film thickness and/or a film quality of the oxide semiconductor layer.

As yet another specific example, the target position of measurement may include a plurality of target positions of measurement, and the target position may be sequentially changed among the plurality of target positions in the positioning, the plurality of target positions being arranged according to a tendency of at least one of (i) an increasing temperature in an annealing treatment performed on the thin-film transistor and (ii) a decreasing temperature in the annealing treatment. With this, it is possible to evaluate a change, variation, etc., in electrical characteristics of the oxide semiconductor layer depending on the temperature distribution in the annealing treatment.

It should be noted that, as a measurement condition, the microwave may have a frequency of 10 GHz or higher, and the excitation light may have a wavelength of 500 nm or shorter.

Furthermore, the present disclosure can be implemented as a method of manufacturing a thin-film transistor. The method of manufacturing a thin-film transistor includes: forming an oxide semiconductor layer above a substrate, the oxide semiconductor layer functioning as a channel layer; forming a channel protection layer above the oxide semiconductor layer; and performing the method of evaluating a thin-film transistor described above. With this, it is possible to manage a film quality of an oxide semiconductor layer in manufacturing processes.

In addition, the present disclosure can be implemented as a thin-film transistor. The thin-film transistor is, for example, a thin film transistor which is formed on a substrate and includes: an oxide semiconductor layer which functions as a channel layer; and a channel protection layer formed above the oxide semiconductor layer, wherein a threshold voltage ranges from 1.5 V to 1.9 V or a resistance value ranges from $10^9$ to $10^{11} \Omega$, the threshold voltage and the resistance value being identified using the method of evaluating a thin-film transistor described above. This implements an oxide semiconductor TFT on which determination based on electrical characteristics of an oxide semiconductor layer has been performed.

Embodiment

Hereinafter, an embodiment of a method of evaluating a thin-film transistor, a method of manufacturing a thin-film transistor, and a thin-film transistor, according to the present disclosure, shall be described in detail with reference to the Drawings. It should be noted that the embodiment described below shows one preferred specific example. The numerical values, shapes, materials, structural elements, the arrangement and connection of the structural elements, steps, the processing order of the steps, etc. shown in the following embodiment are mere examples, and therefore do not limit the scope of the appended claims and their equivalents.

Furthermore, among the structural elements in the following exemplary embodiment, structural elements not recited in any one of the independent claims indicating the broadest concepts of the present disclosure are described as arbitrary structural elements included in a preferred embodiment.

FIG. 1A is a block diagram showing a configuration of a measuring device 10 which performs a method of evaluating a thin-film transistor according to the present embodiment. The measuring device 10 performs a non-contact evaluation by a microwave photoconductivity decay method, on an oxide semiconductor thin film included in a channel layer of a TFT 21, at a plurality of timings in the processes of manufacturing the TFT 21 (i.e., in-line inspection). To do so, the measuring device 10 irradiates an oxide semiconductor layer formed above a substrate 30 with excitation light and a microwave, and detects the intensity of a reflected wave of the microwave from a sample, which changes according to the irradiation of the excitation light. It should be noted that, although the measuring device 10 has a fundamental configuration same as a fundamental configuration of PTL 1, unique devisal has been incorporated in the measurement conditions and the measurement method, in order to allow evaluation of the TFT 21 in each of the manufacturing processes, as described below.

The substrate 30 is a glass substrate, for example. The TFT 21 is an oxide semiconductor TFT formed to be disposed in a matrix on a surface of the substrate 30 (an intermediate of each of the manufacturing processes before completed as a TFT is included). It should be noted that the substrate 30 and the TFT 21 (including the intermediates) formed above the substrate 30 are collectively called a panel 20. The panel 20 is, for example, a driving panel for an organic EL display which includes the substrate 30 and a plurality of TFTs 21 disposed in a matrix above the substrate 30, and includes not only one display panel but also a plurality of display panels (for example, gang printing for four displays).

As illustrated in FIG. 1A, the measuring device 10 includes: a pulse laser 11; a microwave oscillator 12; a waveguide assembly 13; a mixer 14; a signal processing device 15; a computer 16; a stage controller 17; and an XY stage 18.

The pulse laser 11 is a light source which emits excitation light with which the TFT 21 is irradiated, and is, for example, a semiconductor laser or the like which emits, as the excitation light, pulsed ultraviolet light having a wavelength of 500 nm or shorter (a wavelength of 349 nm, for example), power ranging from 1 nJ/pulse to 10 µJ/pulse, a pulse width of 5 nsec, and a beam diameter of 1.5 mm. It should be noted that excitation light of the measuring device disclosed by PTL 1 has a pulse width of 15 nsec which, in some cases, is an order of the same time period as the decay periods T1 and T2 which will be described later, leading to insufficient measurement accuracy. In order to ensure a constant measurement accuracy with the TFT 21 being the measurement target, excitation light having a pulse width of several nsec or shorter is required. Accordingly, the pulse width is set to 5 nsec in the present embodiment. In addition, the pulse energy is 1 µJ/pulse in the measurement example disclosed by PTL 1. However, according to a study of the inventors of the present disclosure, power greater than 1 µJ/pulse is suitable for ensuring constant measurement accuracy with the TFT 21 being the measurement target. In consideration of preventing deterioration of the oxide semiconductor layer, the pulse energy is preferably in a range from 1 µJ/pulse to 2 µJ/pulse, and best measurement accuracy is obtained when the pulse energy is approximately 1.45 µJ/pulse.

The microwave oscillator 12 is a signal source which outputs a microwave (electromagnetic wave) with which a measurement position of the TFT 21 is irradiated. As the microwave oscillator 12, a signal source which outputs a microwave having a frequency of at least 10 GHz is suitable, and the microwave oscillator 12 in the present embodiment is, for example, a Gunn diode having a frequency of 26 GHz.

The waveguide assembly 13 is an assembly having a function of irradiating a measurement position of the TFT 21 with excitation light output from the pulse laser 11, and a function of causing the microwave output from the microwave oscillator 12 to branch and outputting the branched microwaves to an LO input terminal of the mixer 14 and the TFT 21, and capturing a reflected wave of the microwave with which the measurement position of the TFT 21 is irradiated and guiding the reflected wave to a RE input terminal of the mixer 14. The waveguide assembly 13, for irradiation of excitation light, includes a mirror, a collection lens, and a waveguide tube which are not illustrated, causes the excitation light output from the pulse laser 11 to be reflected off the mirror and collected by the collection lens, and then irradiates the measurement position of the TFT 21 with the excitation light via the waveguide tube. Furthermore, the waveguide assembly 13 includes a directional coupler, a magic T, and a waveguide tube which are not illustrated, for detecting the above-described irradiation of microwaves and the reflected waves. With this configuration, the waveguide assembly 13 causes the microwave output from the microwave oscillator 12 to branch into two by the directional coupler, and transmits a first microwave which is one of the branched microwaves to the magic T, while transmits a second microwave which is the other of the branched microwaves to the LO input terminal of the mixer 14. Then, the waveguide assembly 13 causes the first microwave transmitted to the magic T to branch into two by the magic T, emits a first main microwave which is one of the branched first microwaves to the measurement position (portion including an excited portion) of the TFT 21 through a first waveguide tube and captures a reflected wave of the first main microwave, and emits a first sub microwave which is the other of the branched first microwaves to a neighborhood (portion not including an excited portion generated by the excitation light) of the TFT 21 through a second waveguide tube and captures a reflected wave of the first sub microwave. Moreover, the waveguide assembly 13 transmits a difference signal of the two reflected waves guided by the first waveguide tube and the second waveguide tube to the magic T (reflected wave difference signals), from the magic T to the RE input terminal of the mixer 14.

The mixer 14 mixes the second microwave and the reflected wave difference signal transmitted from the waveguide assembly 13, thereby outputting a detection signal. The detection signal is a signal indicating an intensity of the reflected wave difference signal (an intensity of the reflected wave of the first microwave with which the TFT 21 is irradiated), and is provided to the signal processing device 15.

The signal processing device 15 is a device which detects a peak value (maximum value) of a change in the intensity of the reflected wave difference signal detected by the mixer 14, and transmits a detection result and a signal indicating a change in the intensity of the reflected wave difference signal, to the computer 16. More specifically, the signal processing device 15, triggered by input of a timing signal from the computer 16, monitors changes in the reflected wave difference signals for a predetermined period of time, and detects a maximum value of levels of the reflected wave difference signal obtained in the monitoring, as a peak value of changes in the intensity of the reflected wave difference signal. Here, the signal processing device 15 includes a delay circuit which performs delay processing on the reflected wave difference signal, sequentially detects a signal intensity with a predetermined sampling cycles (2.5 nsec according to the present embodiment) with respect to the signal after delay processing, and detects a peak value of a change in the intensity of the reflected wave difference signal. The signal processing device 15 outputs the peak value and the signal intensity of a sampled reflected wave difference signal to the computer 16.

The computer 16 includes a CPU, a storage, an input and output interface, and the like, and performs various processes in response to predetermined programs executed by the CPU. For example, the computer 16 outputs a timing signal indicating a timing of outputting excitation light to the pulse laser 11 and the signal processing device 15, extracts the peak value of the reflected wave difference signals detected by the signal processing device 15 and the sampled reflected wave difference signal (chronological data) and records them onto the storage. The recorded peak value and the reflected wave difference signal are used in evaluation of the TFT 21.

The stage controller 17 controls driving of the XY stage 18 according to an instruction from the computer 16, and thereby controls positioning a measurement position for the TFT 21.

The XY stage 18 is a mechanism section for moving the panel 20 mounted thereon in an X direction and a Y direction on a horizontal surface, and controlled by the stage controller 17.

It should be noted that, although illustration is omitted in FIG. 1A, a substrate holding unit or the like for fixing the panel 20 is disposed between the XY stage 18 and the panel 20, and the panel 20 is mounted on the substrate holding unit or the like.

With the measuring device 10 according to the present embodiment which has the above-described configuration, it is possible to measure electrical characteristics of the oxide semiconductor layer included in the channel layer of the TFT 21, using the microwave photoconductive decay method. FIG. 1B is a diagram illustrating time variation of reflectance of microwaves obtained by the measuring device 10 illustrated in FIG. 1A. The measuring device 10 irradiates the TFT 21 including the oxide semiconductor layer (or an intermediate) with excitation light and a microwave and measures a maximum value of reflected waves from the oxide semiconductor layer which changes according to the irradiation of the excitation light ("peak value" in FIG. 1B). Then, irradiation of the excitation light is stopped to measure a change in the reflectance of the reflected wave after the stop of irradiation. With the above-described measurement, (i) a period of time taken for the reflectance to decay from the peak value to 1/e (e is a base of natural logarithm) of the peak value (i.e., "decay period T1" in FIG. 1B), (ii) a period of time taken for the reflectance to decay from 1/e of the peak value to $1/e^2$ of the peak value (i.e., "decay period T2" in FIG. 1B), and (iii) the peak value of the reflectance (i.e., "peak value" in FIG. 1B) are calculated, and it is possible to perform determination related to the threshold voltage and the resistance value of the oxide semiconductor layer based on the calculated decay period and the peak value. It should be noted that, of the above-described two types of decay periods, the period T1 taken for the reflectance to decay from the peak value to 1/e of the peak value is a lifetime of a carrier (carrier life duration). In addition, a period of time taken for the reflectance to decay from the peak value to $1/e^2$ of the peak value may be included as the decay period.

More specifically, the decay period calculated by the measuring device 10 according to the present embodiment is a period of time taken for the reflectance to decay from a first value to a second value. The decay period is at least one of a period of time taken for the reflectance to decay from a peak value to 1/e of the peak value, a period of time taken for the reflectance to decay from 1/e of the peak value to $1/e^2$ of the peak value, and a period of time taken for the reflectance to decay from the peak value to $1/e^2$ of the peak value, e being a base of natural logarithm.

The principle of measurement of such a microwave photoconductive decay method is described as below.

Excitation light emitted to the oxide semiconductor layer of the TFT 21 is absorbed by the oxide semiconductor layer, and generates an excess carrier. The more the excess carrier density increases, the more the disappearance rate increases, and when the carrier generation rate and the carrier disappearance rate are equal to each other, the density of the excess carriers indicates a fixed peak value. As described above, saturation occurs when the generation rate and the disappearance rate of excess carriers are equal to each other, and the density of the excess carriers is kept at a fixed value. However, when irradiation of the excitation light is stopped, the excess carriers start to decrease due to recombination and disappearance of the excess carriers, and finally return to the state which indicates the value previous to the irradiation of the excitation light.

The microwave emitted to the oxide semiconductor layer is reflected at a reflectance based on a resistivity determined by the density of free carriers in the oxide semiconductor layer. Since the resistivity of the oxide semiconductor layer decreases due to generation of an excess carrier resulting from the irradiation of the excitation light, the reflectance of the microwave accordingly increases. In addition, when the irradiation of the excitation light is stopped, the resistivity increases along with decrease in the number of excess carriers, and thus the reflectance of the microwave decreases.

The intensity of the reflected wave of a microwave is subject to influence of an excess carrier generated in a measurement position as a result of irradiation of excitation light, and the degree of the influence also depends on the degree of defect or the like in the measurement position. More specifically, the intensity of the reflected wave of a microwave emitted to the oxide semiconductor layer decays after temporarily increased as a result of irradiation of excitation light. A peak value of the intensity of the reflected wave decreases as more defects are present in the oxide semiconductor layer, and the decay period (lifetime etc.) is also shortened. For that reason, the intensity of the reflected wave of a microwave emitted to the TFT 21 is an indicator of electrical characteristics (threshold voltage, resistance value) of the oxide semiconductor layer of the TFT 21. The threshold voltage of the oxide semiconductor layer is proportional to the decay period of the reflectance, as described below. Furthermore, the resistance value of the oxide semiconductor layer has a positive correlation of which the resistance value increases as the peak value of the intensity of the reflected wave is greater, and the resistance value increases as the decay period of the reflectance is greater. Accordingly, by identifying a relation between a measured value and electrical characteristics (a decay period and a threshold voltage, a decay period and a resistance value, and a peak value and a resistance value) in advance using a plurality of samples of which the electrical characteristics are known, and by referring to the relation, it is possible to determine electrical characteristics (threshold voltage and resistance value) from the measured value obtained for an unknown sample. It should be noted that the determining includes at least one of determining electrical characteristics (a threshold voltage and a resistance value); and a determining whether or not the electrical characteristics (a threshold and a resistance value) falls within a predetermined range (including determining of whether a non-defective product or a defective product).

Figure 2:
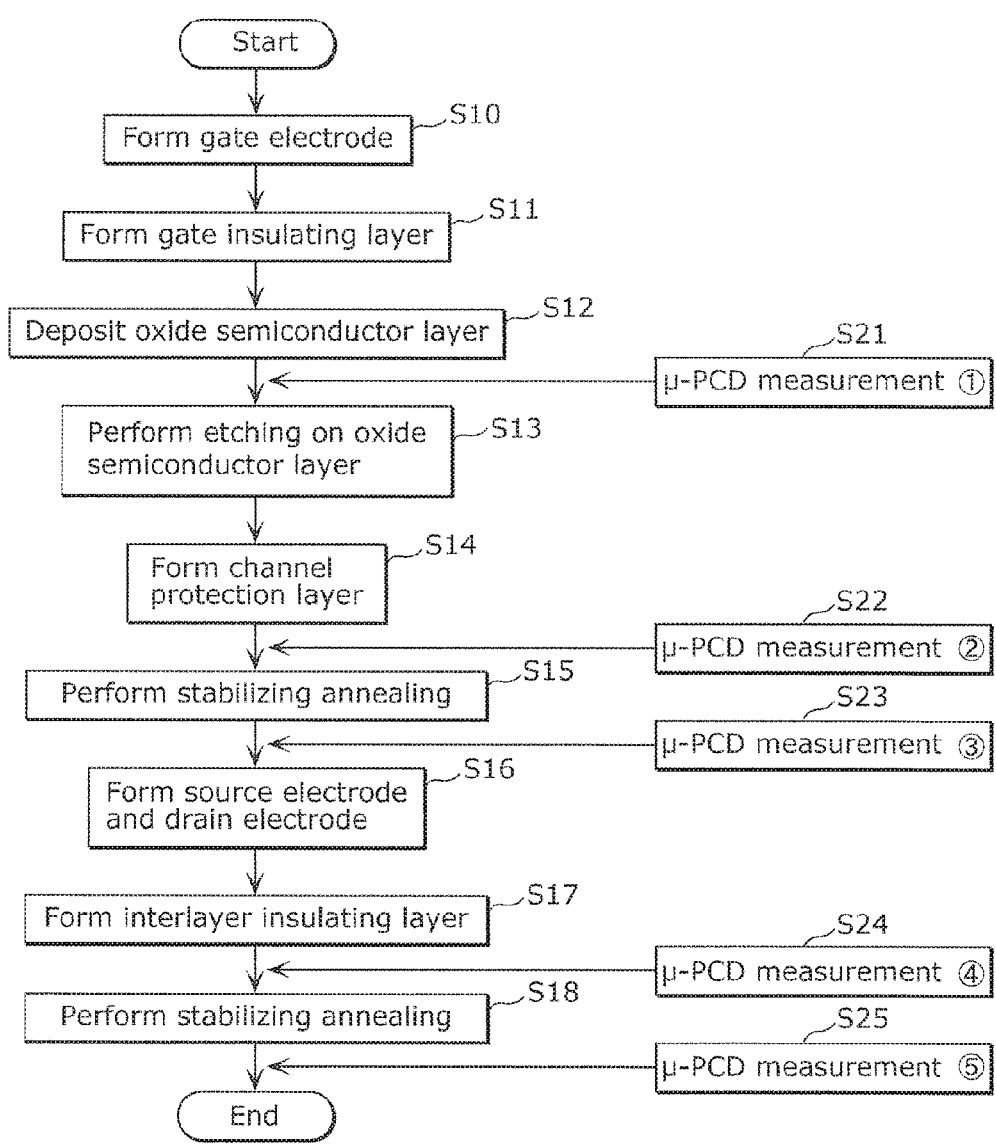
FIG. 2 is a flowchart illustrating an example of the procedure of a TFT manufacturing process, and measurement timing according to the microwave photoconductive decay method.
Figure 3:
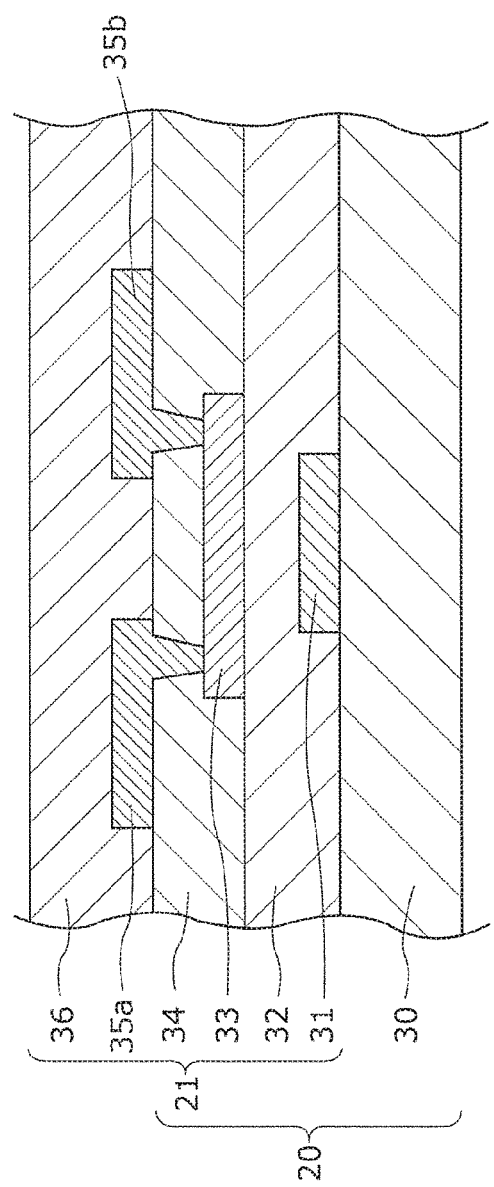
FIG. 3 is a diagram illustrating a stacked structure of a TFT which is formed through the manufacturing process illustrated in FIG. 2.

FIG. 2 is a flowchart illustrating a procedure of manufacturing processes of the TFT 21, and an example of the timing of measurement according to the microwave photoconductive decay method (hereinafter also referred to as "µ-PCD measurement"). FIG. 3 is a diagram illustrating a stacked structure of the TFT 21 which is formed through such a manufacturing process.

First, a gate electrode 31 is formed on a substrate 30 (S10). For example, a glass substrate is prepared as the substrate 30, and a metal film including an Mo film and a Cu film stacked in order is deposited on the substrate 30, using a sputtering method. Then, the gate electrode 31 is formed by patterning the metal film though photolithography and wet etching. The thickness of the gate electrode 31 is, for example, 20 nm to 500 nm.

Next, a gate insulating layer 32 is formed above the substrate 30 in such a manner that the gate insulating layer 32 covers the gate electrode 31 (S11). For example, the gate insulating layer 32 is formed by depositing a silicon oxide film or a silicon nitride film through a plasma CVD method above the substrate 30 on which the gate electrode 31 is formed. The thickness of the gate insulating layer 32 is, for example, 50 nm to 300 nm.

Next, an oxide semiconductor layer is deposited on the gate insulating layer 32 (S12). For example, an oxide semiconductor layer of amorphous InGaZnO is deposited by performing sputtering in the presence of oxygen, using a target material of a composition ratio of In:Ga:Zn=1:1:1. The thickness of the oxide semiconductor layer is, for example, 20 nm to 200 nm.

After depositing the oxide semiconductor layer, a first measurement is performed using the microwave photoconductivity decay method (S21). This is for the purpose of checking whether or not an oxide semiconductor layer having desired electrical characteristics is deposited.

Next, an oxide semiconductor layer 33 included in a channel layer for each of the TFTs 21 is formed by patterning the deposited oxide semiconductor layer through the photolithography and the wet etching (S13). It should be noted that, in the present Description, to generate an oxide semiconductor layer included in a channel layer for each of the TFTs is called "to form", and to generate an oxide semiconductor layer before patterning for each of the TFTs is performed is called "to deposit".

Next, a channel protection layer 34 is formed above the gate insulating layer 32 in such a manner that the channel protection layer 34 covers the oxide semiconductor layer 33 (S14). For example, the channel protection layer 34 is formed by depositing a silicon oxide film above the gate insulating layer 32 and the oxide semiconductor layer 33 through a plasma CVD. The thickness of the channel protecting layer 34 is, for example, 50 nm to 500 nm.

After forming the channel protection layer 34, a second measurement is performed using the microwave photoconductivity decay method (S22). This is for the purpose of checking whether or not the oxide semiconductor layer 33 is damaged due to the forming of the channel protection layer 34 and whether or not there is a change in the electrical characteristics of the oxide semiconductor layer 33 before and after a following annealing treatment.

Next, the annealing treatment (an example of a first annealing treatment) is performed in order to improve stability of electrical characteristics (shift of a threshold voltage, etc.) of the oxide semiconductor layer 33 (S15). For example, the annealing treatment is performed at a temperature from 250 degrees Celsius to 400 degrees Celsius for approximately an hour on a panel 20 (intermediate) generated so far using an annealing device.

After performing the annealing treatment, a third measurement is performed using the microwave photoconductivity decay method (S23). This is for the purpose of checking whether or not there is a change in the electrical characteristics of the oxide semiconductor layer 33 due to the annealing treatment.

Next, a source electrode 35a and a drain electrode 35b are formed with a distance therebetween on the channel protection layer 34 (S16). More specifically, the channel protection layer 34 is first etched through photolithography and dry etching, thereby forming a contact hole above each of regions functioning as a source region and a drain region of the oxide semiconductor layer 33. Then, a metal film including an Mo film, a Cu film, and a CuMn film stacked in order is deposited through the sputtering in the contact hole and on the channel protection layer 34, and is patterned through the photolithography and the wet etching, thereby forming a source electrode 35a and a drain electrode 35b. The thickness of the source electrode 35a and the drain electrode 35b is 100 nm to 500 nm, for example.

Next, an interlayer insulating layer 36 is formed above the channel protection layer 34 in such a manner that the interlayer insulating layer 36 covers the source electrode 35a and the drain electrode 35b (S17). For example, the interlayer insulating layer 36 is formed by depositing a silicon oxide film through the plasma CVD, on the source electrode 35a, the drain electrode 35b, and the channel protection layer 34. The thickness of the interlayer insulating layer 36 is, for example, 50 nm to 1000 nm.

After forming the interlayer insulating layer 36, a fourth measurement is performed using the microwave photoconductivity decay method (S24). This is for the purpose of checking whether or not the oxide semiconductor layer 33 is damaged due to the forming of the interlayer insulating layer 36 and whether or not there is a change in the electrical characteristics of the oxide semiconductor layer 33 before and after the following annealing treatment.

Finally, the annealing treatment (an example of the second annealing treatment) is performed for the purpose of stabilizing the electrical characteristics of the TFT 21 (S18). For example, the annealing treatment is performed at a temperature from 250 degrees Celsius to 400 degrees Celsius for approximately an hour on the panel 20 using an annealing device.

After performing the annealing treatment, a fifth measurement is performed using the microwave photoconductivity decay method (S25). This is for the purpose of checking whether or not there is a change in the electrical characteristics of the oxide semiconductor layer 33 due to the annealing treatment.

As described above, in the manufacturing processes of the TFT 21, it is possible to evaluate whether or not there is a change in the electrical characteristics of an oxide semiconductor layer just after depositing, due to a damage or the like in the manufacturing processes, by performing five times of a measurement using the microwave photoconductive decay method as in-line processing and in a non-contact manner.

It should be noted that, although a total of five measurement timings; that is, after the deposition of the oxide semiconductor layer and before and after the annealing treatment performed twice subsequent to the deposition, are exemplified in the flowchart of FIG. 2, the timings of the measurement are not limited to these measurement timings. The measurement may be performed for each manufacturing process after deposition of the oxide semiconductor layer, or may be omitted after a manufacturing process which is expected to cause little damage to the oxide semiconductor layer.

Figure 4:
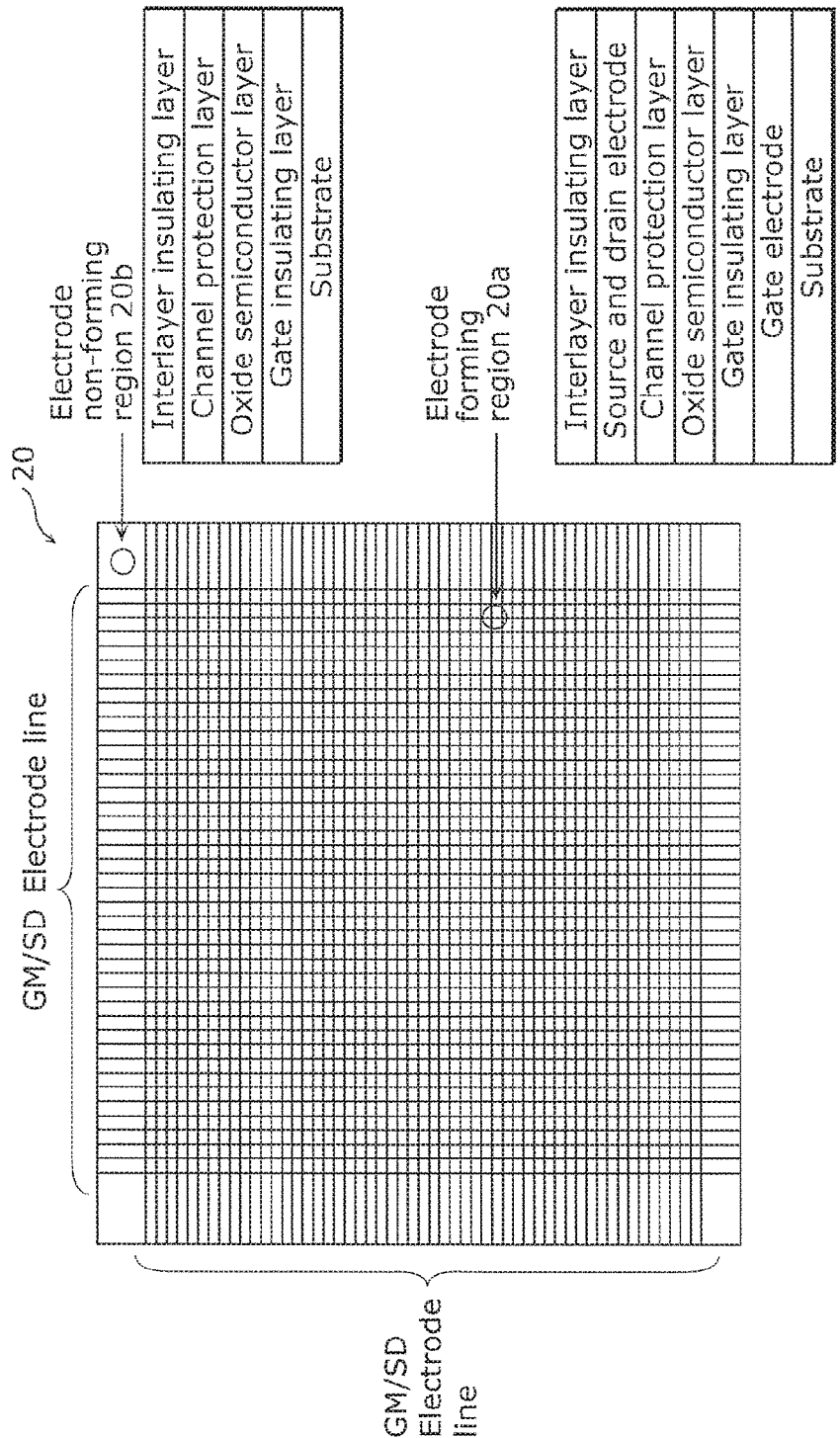
FIG. 4 is a diagram illustrating a position of a measurement on a panel by the microwave photoconductive decay method.

FIG. 4 is a diagram illustrating a position of a measurement on the panel 20 using the microwave photoconductivity decay method according to the present embodiment. In FIG. 4, vertical lines and horizontal lines drawn on the panel 20 ("GN/SD" electrode lines in the diagram) indicate positions at which the gate electrode 31, the source electrode 35a, the drain electrode 35b, and lines connected to these electrodes are formed.

It is preferable that the measurement using the microwave photoconductivity decay method is performed not on an electrode forming region 20a in which the gate electrode 31, the source electrode 35a, and the drain electrode 35b are formed, but an electrode non-forming region 20b in which the gate electrode 31, the source electrode 35a, and the drain electrode 35b are not formed.

This is due to the subsequent reason.

The electrode forming region 20a is a region in which all of the structural elements included in the TFT 21 illustrated in FIG. 3 are disposed; that is, a region in which the substrate 30, the gate electrode 31, the gate insulating layer 32, the oxide semiconductor layer 33, the channel protection layer 34, the source electrode 35a, the drain electrode 35b, and the interlayer insulating layer 36 are deposited. The electrode non-forming region 20b is a region which is formed concurrently with the electrode forming region 20a, and a region in which the gate electrode 31, the source electrode 35a, and the drain electrode 35b are not formed, and the substrate 30, the gate insulating layer 32, the oxide semiconductor layer 33, the channel protection layer 34, and the interlayer insulating layer 36 are deposited, among the structural elements included in the TFT 21 illustrated in FIG. 3. The microwave photoconductivity decay method is a method of measuring how a reflectance of a microwave corresponding to a resistivity determined by a free carrier density in a sample changes before and after irradiation of excitation light. In such a region as the electrode forming region 20a in which a conductive material such as metal, indium tin oxide (ITO), or the like is deposited, an excess carrier is less likely to be excited in response to irradiation of excitation light because the free carrier density is sufficiently high before the irradiation of excitation light, and thus the reflectance of the microwave is less likely to change. It is therefore considered that calculation of a decay period or a peak value using the microwave photoconductivity decay method is difficult.

It is possible to evaluate the oxide semiconductor layer 33 included in the TFT 21 by performing measurement using the microwave photoconductivity decay method on the oxide semiconductor layer 33 in the electrode non-forming region 20b. It should be noted that, although any region in the panel 20 may be set as a measurement region for the measurement using the microwave photoconductivity decay method as long as the conductive material such as metal, ITO, or the like is not deposited in the region, it is desirable to select a region in which a film thickness or a film quality of the oxide semiconductor layer 33 can change in the manufacturing processes of the TFT 21, as described later.

Figure 5:
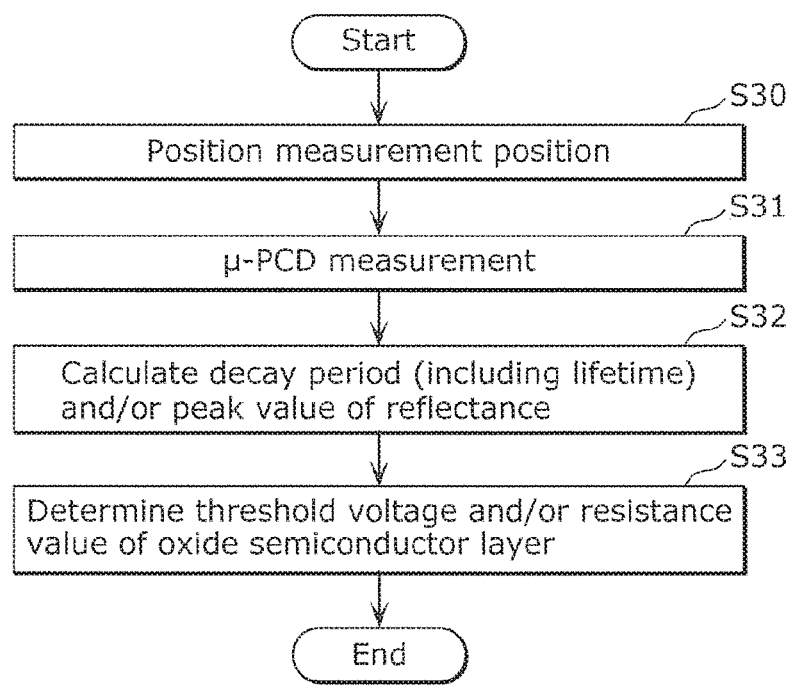
FIG. 5 is a flowchart showing a procedure of the method of evaluating a TFT.

FIG. 5 is a flowchart showing a procedure of the method of evaluating a TFT according to the present embodiment. In other words, FIG. 5 shows a control procedure and processes performed by the computer 16 of the measuring device 10 illustrated in FIG. 1A.

First, positioning of a measurement position is performed (positioning step S30). When performing measurement sequentially at a plurality of measurement positions, positioning which changes a target position of the measurement is performed. More specifically, the computer 16 moves the XY stage 18 such that measurement using the microwave photoconductivity decay method is performed on a desired measurement position in the oxide semiconductor layer 33, by providing a command to the stage controller 17.

Next, the measurement using the microwave photoconductivity decay method (μ-PCD measurement) is performed (measuring step S31). In other words, a change in a reflectance of a microwave emitted to the oxide semiconductor layer 33 which is a measurement target is measured, while the oxide semiconductor layer 33 is irradiated with excitation light by pulse irradiation. More specifically, the computer 16 outputs a timing signal indicating a timing of outputting excitation light to the pulse laser 11 and the signal processing device 15, extracts the peak value of the reflected wave difference signals detected by the signal processing device 15 and the sampled reflected wave difference signal, and records the detected signals onto the storage.

Next, at least one of a decay period and a peak value of the reflectance are calculated based on a measurement result obtained in measuring step S31 (calculating step S32). In other words, based on a change in the reflectance obtained in the measuring step S31, at least one of (i) a decay period that is a period of time taken for the reflectance to decay from the peak value to $1/e$ of the peak value (lifetime) or a period of time taken for the reflectance to decay from $1/e$ of the peak value to $1/e^2$ of the peak value, and (ii) the peak value of the reflectance is calculated. More specifically, the computer 16, based on the peak value of the reflected wave difference signal and the chronological data of the reflected wave difference signal which have been provided from the signal processing device 15 and recorded in the storage, calculates the peak value of the reflected wave difference signal as a peak value of the reflectance, and calculates a decay period which is a period of time taken for the reflectance to decay from the peak value to $1/e$ of the peak value and a period of time taken for the reflectance to decay from $1/e$ of the peak value to $1/e^2$ of the peak value. It should be noted that a period of time taken for the reflectance to decay from the peak value to $1/e^2$ of the peak value may be used as the decay period.

In other words, the decay period calculated in the calculating step S32 is a period of time taken for the reflectance to decay from a first value to a second value. More specifically, the decay period is at least one of a period of time taken for the reflectance to decay from a peak value to $1/e$ of the peak value, a period of time taken for the reflectance to decay from $1/e$ of the peak value to $1/e^2$ of the peak value, and a period of time taken for the reflectance to decay from the peak value to $1/e^2$ of the peak value, e being a base of natural logarithm.

Finally, based on the calculation result obtained in the calculating step S32, the computer 16 performs determination related to at least one of a threshold voltage and a resistance value of the oxide semiconductor layer 33 (determining step S33). In determination related to the threshold voltage, for example, at least one of identification of a threshold voltage and determination of whether or not a threshold voltage falls within a predetermined range (including determining of whether a non-defective product or a defective product) is performed. Thus, by identifying a relation between a decay period and a threshold voltage in advance using a plurality of samples of which the electrical characteristics are known and by referring to the relation, it is possible to determine the threshold voltage of the oxide semiconductor layer 33 based on the decay period obtained for an unknown sample. Likewise, in determination related to a resistance value, at least one of identification of a resistance value and determination of whether or not a resistance value falls within a predetermined range (including determining of whether a non-defective product or a defective product) is performed. Thus, by identifying a relation between (i) a decay period or a peak value and (ii) a resistance value in advance using a plurality of samples of which the electrical characteristics are known and by referring to the relation, it is possible to determine the resistance value of the oxide semiconductor layer 33 based on the decay period or the peak value obtained for an unknown sample.

It should be noted that, although the decay period and the peak value of the reflectance are calculated and the electrical characteristics of both of the threshold voltage and the resistance value of the oxide semiconductor layer are determined based on the calculated decay period and the peak value of the reflectance, in the flowchart illustrated in FIG. 5, determination of all of the electrical characteristics by calculating all of the parameters is not necessarily performed in the manufacturing processes of the panel 20. In consideration of a trade-off relationship between accuracy and a period of time allowed for evaluation and, it is sufficient that at least one parameter (either one of two types of decay periods, or a peak value) is calculated and at least one of the electrical characteristics (a threshold voltage or a resistance value) is determined.

Next, an example of measurement using the microwave photoconductivity decay method will be described.

The following describes details of the TFT that is a measurement target.

After depositing a gate electrode material on a glass substrate, at the time of etching processing for forming the gate electrode 31, etching is performed on the gate electrode material also at a measurement position at which measurement using the microwave photoconductivity decay method is performed, and an amorphous oxide semiconductor layer (InGaZnO) is deposited under the conditions described below after forming of the gate insulating layer 32.

A composition of a sputtering target: $InGaZnO_4$
A temperature of the substrate: room temperature
A thickness of the oxide semiconductor layer: 60 nm
An amount of added oxygen: $O_2/(Ar+O_2)=5\%$ Also in electrode forming processes subsequent to the above-described manufacturing processes, etching is performed on an electrode material at a position of measurement using the microwave photoconductivity decay method, and only the channel protection layer 34 and the interlayer insulating layer 36 are stacked. In other words, evaluation using the microwave photoconductivity decay method is performed after each process in the state where the conductive material is not stacked.

A material and a film thickness of each of the other layers included in the TFT are as described above with reference to FIG. 2 and FIG. 3.

Furthermore, the following describes conditions for the measurement using the microwave photoconductivity decay method (conditions of excitation light using a laser.

A laser wavelength: 349 nm
A pulse width: 5 nsec
Pulse energy: 1 nJ/pulse to 10 µJ/pulse
A beam diameter: 1.5 mmφ

FIG. 6A, FIG. 6B, FIG. 7A, FIG. 7B, and FIG. 7C illustrate results of measurement using the microwave photoconductive decay method, obtained under the measurement conditions described above. It should be noted that the electrical characteristics of a test element group (TEG) of which the electrical characteristics are known and which is disposed in a vicinity of a measurement position and the results of measurement using the microwave photoconductivity decay method are illustrated.

Figure 6A:
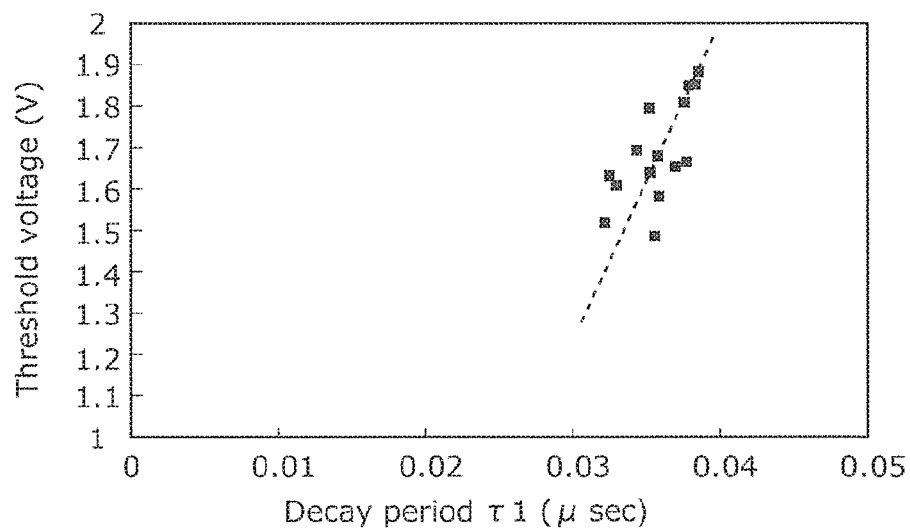
FIG. 6A is a diagram illustrating an example of the result of a measurement regarding a threshold voltage (i.e., the relationship between a decay period T1 of reflectance and a threshold voltage of the oxide semiconductor layer).
Figure 6B:
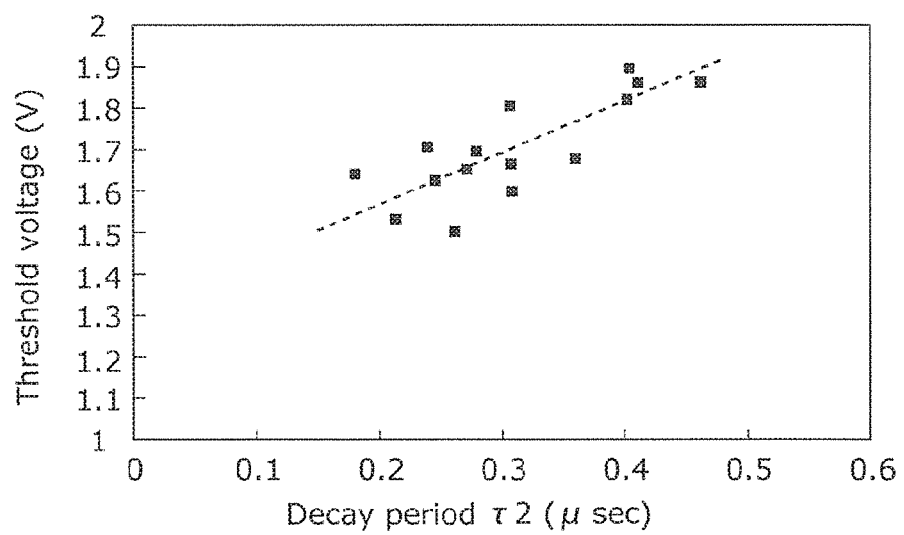
FIG. 6B is a diagram illustrating another example of the result of a measurement regarding a threshold voltage (i.e., the relationship between a decay period T2 of reflectance and a threshold voltage of the oxide semiconductor layer).

FIG. 6A is a diagram illustrating results of measurement obtained by performing measurement using the microwave photoconductivity decay method on a plurality of TFTs each including the oxide semiconductor layer of which the threshold voltage is known (relation between the decay period T1 of a reflectance and the threshold voltage of the oxide semiconductor layer). The decay period T1 is a time period taken for the reflectance to decay from the peak value to 1/e of the peak value (lifetime). FIG. 6B is a diagram illustrating results of measurement obtained by performing measurement using the microwave photoconductivity decay method on a plurality of TFTs each including the oxide semiconductor layer of which the threshold voltage is known (relation between the decay period T2 of a reflectance and the threshold voltage of the oxide semiconductor layer). The decay period T2 is a time period taken for the reflectance to decay from 1/e of the peak value to $1/e^2$ of the peak value.

As can be seen from FIG. 6A, the decay period T1 of the reflectance and the threshold voltage of the oxide semiconductor layer are proportional to each other. Likewise, as can be seen from FIG. 6B, the decay period T2 of the reflectance and the threshold voltage of the oxide semiconductor layer are proportional to each other. Here, the decay period T2 is expressed by a value ten times greater than a value that expresses the decay period T1, and is distributed in an extended range of time. It can be thus said that the decay period T2 has a greater dependency on the threshold voltage than the decay period T1, and excels as a parameter used in evaluation of the threshold voltage.

The following is considered to be the reason why such a correlation is obtained regarding the decay period of the reflectance and the threshold voltage of the oxide semiconductor layer. More specifically, the threshold voltage of the oxide semiconductor layer is known to depend on a carrier trap level density in the oxide semiconductor layer or at the interface. Meanwhile, the microwave photoconductivity decay method is a method of evaluating the process in which excess carriers excited in an oxide semiconductor layer are recombined and decayed by a trap level or the like, and the decay of intensity of a reflected wave from the oxide semiconductor layer after irradiation of excitation light depends heavily on the trap level density in the oxide semiconductor layer or at the interface. Thus, it is estimated that the threshold voltage of the oxide semiconductor layer and the decay period of the reflectance are in a positive correlation, more specifically, are proportional to each other.

It should be noted that the threshold voltage of the oxide semiconductor layer changes according to the effect of hydrogen diffusion, etc. from not only the oxide semiconductor layer but also the gate insulating layer, the channel protection layer, and the interlayer insulating layer. The evaluation disclosed by PTL 1 is an evaluation which performs the microwave photoconductivity decay method on an oxide semiconductor thin film deposited on the surface of a glass substrate. Accordingly, in view of the sample structure, although it is possible to evaluate carrier mobility of the oxide semiconductor thin film alone, the evaluation disclosed by PTL 1 is not suitable for a quantitative evaluation of the threshold voltage that is determined in the real structure of a TFT that is a stacked structure. According to the present embodiment, it is possible to perform an evaluation on the real structure of a TFT in which a gate insulating layer is included between the surface of the glass substrate and the oxide semiconductor layer, enabling the evaluation of not only the film property such as mobility, but also the threshold voltage that indicates the electrical characteristics of the TFT.

Figure 7A:
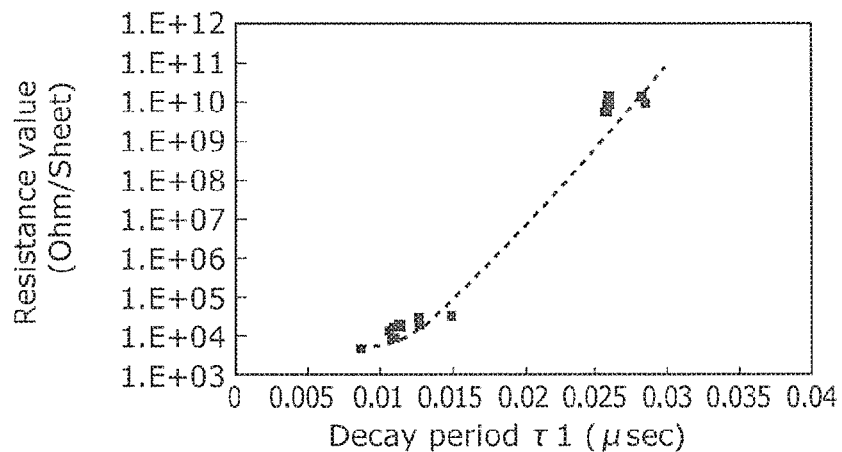
FIG. 7A is a diagram illustrating an example of the result of a measurement regarding a resistance value (i.e., the relationship between the decay period T1 of reflectance and a resistance value of the oxide semiconductor layer).
Figure 7B:
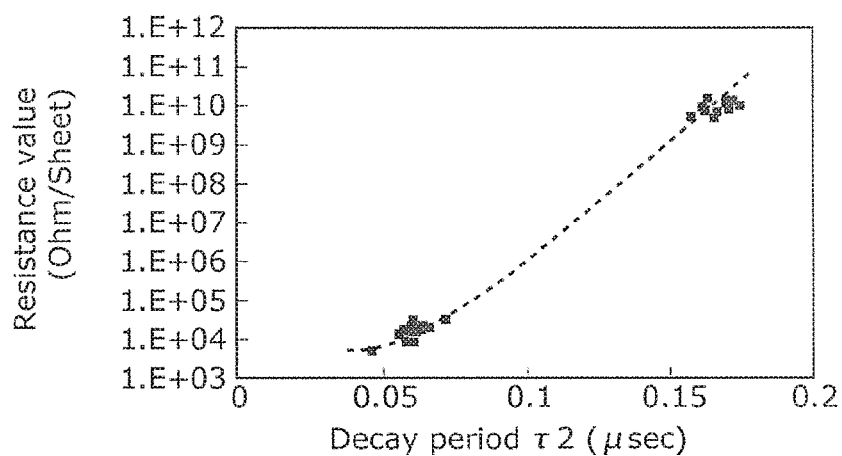
FIG. 7B is a diagram illustrating another example of the result of a measurement regarding a resistance value (i.e., the relationship between the decay period T2 of reflectance and a resistance value of the oxide semiconductor layer).
Figure 7C:
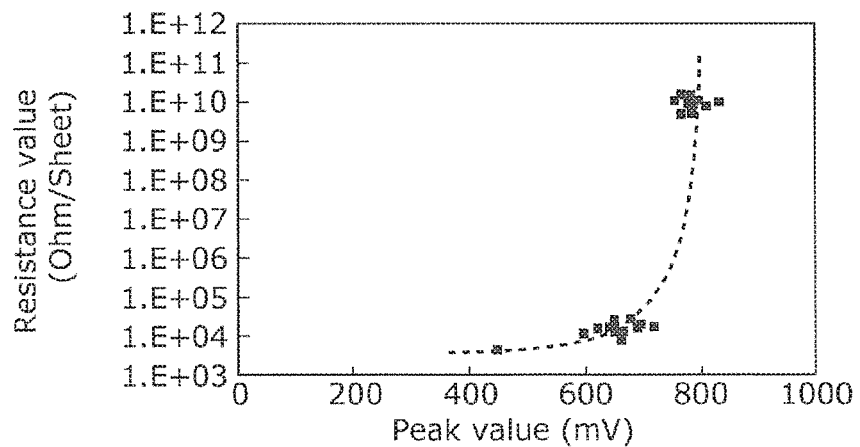
FIG. 7C is a diagram illustrating another example of the result of a measurement regarding a resistance value (i.e., the relationship between the peak value of reflectance and a resistance value of the oxide semiconductor layer).

FIG. 7A is a diagram illustrating results of measurement obtained by performing measurement using the microwave photoconductivity decay method on a plurality of TFTs each including the oxide semiconductor layer of which the resistance value is known (relation between the decay period T1 of a reflectance and the resistance value of the oxide semiconductor layer). FIG. 7B is a diagram illustrating results of measurement obtained by performing measurement using the microwave photoconductivity decay method on a plurality of TFTs each including the oxide semiconductor layer of which the resistance value is known (relation between the decay period T2 of a reflectance and the resistance value of the oxide semiconductor layer). FIG. 7C is a diagram illustrating results of measurement obtained by performing measurement using the microwave photoconductivity decay method on a plurality of TFTs each including the oxide semiconductor layer of which the resistance value is known (relation between the peak value of a reflectance and the resistance value of the oxide semiconductor layer). It should be noted that a sheet resistance (Ohm/Sheet) is plotted as an example of the resistance value in FIG. 7A to FIG. 7C. In the present Description, the term "resistance value" is a resistance value in a broad meaning including a resistance, a sheet resistance, and a resistivity in the case where a film thickness, a width, and a length of the oxide semiconductor layer are fixed under certain conditions.

As can be seen from FIG. 7A and FIG. 7B, the resistance value of the oxide semiconductor and the decay periods T1 and T2 of the reflectance have a positive correlation that a value of each of the decay periods T1 and T2 increases as the resistance value is greater. Likewise, as can be seen from FIG. 7C, the resistance value of the oxide semiconductor and the peak value of the reflectance have a positive correlation of which the greater the resistance value is, the greater the peak value is. It should be noted that a sample having a resistance value that ranges in a distribution of $10^9 \Omega$ to $10^{11} \Omega$ is a sample that properly operates as a TFT, and a sample having the resistance value that ranges in a distribution of $10^3 \Omega$ to $10^5 \Omega$ is a sample that does not properly operate as a TFT.

The following is considered to be the reason why such a correlation as illustrated in FIG. 7A and FIG. 7B is obtained regarding the decay period of the reflectance and the resistance value of the oxide semiconductor layer. That is, when the resistance value is small (i.e., the density of free carriers is high), it is considered that there are a large number of levels of deficiency which is a source of supplying free carriers. For that reason, it is considered that the percentage of recombination in the levels of deficiency of excess carrier excited by excitation light increases, and the decay period is reduced.

In addition, the following is considered to be the reason why such a correlation as illustrated in FIG. 7C is obtained regarding the peak value of the reflectance and the resistance value of the oxide semiconductor layer. The reflectance of a microwave increases when the resistivity that is determined by the density of free carrier decreases, as described above. However, the graph illustrated in FIG. 7C indicates a result that the peak value of the reflectance decreases when the resistance value decreases. This is because the peak value obtained by the measuring device 10 does not indicate a simple reflectance, and a difference in the reflectance is observed before and after irradiation of excitation light (performs differential detection). More specifically, when the resistance value is low (i.e., the density of free carrier is high), the reflectance itself increases without irradiation of excitation light because there are already many free carriers to some degree, however, there is not much change in the reflectance even with irradiation of excitation light because an absolute number of the excess carriers that can be excited with irradiation of excitation light is small. As a result, the peak value obtained as the differential detection is a small value.

The evaluation of a resistance value as described above allows an evaluation of a resistance value of the oxide semiconductor layer even when the channel protection layer, or the channel protection layer and further the interlayer insulating layer are stacked. It is therefore possible to perform an evaluation of effect on a resistance value of the oxide semiconductor layer by each of the deposition processes and annealing processes, in a non-destructive and non-contacting manner.

It should be noted that, as can be seen from the measurement results illustrated in FIG. 6A, FIG. 6B, FIG. 7A, FIG. 7B, and FIG. 7C, the threshold voltage of a sample that normally operates as a TFT ranges from 1.5 V to 1.9 V, for example, and the resistance value ranges from $10^9 \Omega$ to $10^{11} \Omega$, for example. Accordingly, an example of a TFT that is determined as a non-defective product by the method of evaluating an oxide semiconductor TFT according to the present embodiment includes an oxide semiconductor layer which functions as a channel layer; and a channel protection layer formed above the oxide semiconductor layer, wherein a threshold voltage ranges from 1.5 V to 1.9 V or a resistance value ranges from $10^9$ to $10^{11} \Omega$, the threshold voltage and the resistance value being identified using the method of evaluating a thin-film transistor described above.

According to the present embodiment as described above, it is possible to evaluate electrical characteristics including a threshold voltage and a resistance value of an oxide semiconductor layer based on a decay period and a peak value of a reflectance of a microwave, targeting not the oxide semiconductor thin film alone but the oxide semiconductor TFT. One of the reasons for enabling such a measurement is that the pulse width of excitation light with which the oxide semiconductor TFT is irradiated is short.

As described above, the pulse width of excitation light is 15 nsec according to the measuring device disclosed by PTL 1. However, the pulse width of excitation light is 5 nsec according to the present embodiment. In the case of a crystalline semiconductor thin film such as polysilicon, the decay period with the microwave photoconductivity decay method is psec order and significantly short, and the decay period T1 and the decay period T2 of the amorphous oxide semiconductor layer are generally several tens of nsec to several hundreds of nsec, and several tens of nsec to several psec, respectively. In evaluation of an oxide semiconductor, there are instances where, with a pulse width of excitation light being 15 nsec, the pulse width is an order of the same time period as the decay periods T1 and T2 which are obtained in an actual measurement, leading to insufficient measurement accuracy. It is therefore considered that several nsec or shorter is preferable as a pulse width of excitation light.

The following describes an example of excellent measurement conditions including other measurement conditions and measurement results. More specifically, ranges of numerical values of decay periods T1 and T2 with which excellent TFT characteristics can be obtained when measured under the measurement conditions below are as follows.

[Ranges of Numerical Values of Decay Periods T1 and T2]
20 nsec<T1<100 nsec
80 nsec<T2<1500 nsec
[Measurement Conditions]
A laser wavelength: 349 nm
A pulse width: 5 nsec
Pulse energy: 1.45 µJ/pulse
Sampling gap: 2.5 nsec It should be noted that, the ranges of numerical values of decay periods T1 and T2 with which excellent TFT characteristics can be obtained vary with changes in the measurement conditions.

The following descries a measurement position for the measurement of the oxide semiconductor TFT using the microwave photoconductivity decay method according to the present embodiment. In other words, a measurement position that is determined by the positioning step S30 described in the flowchart of FIG. 5 will be described.

Figure 8A:
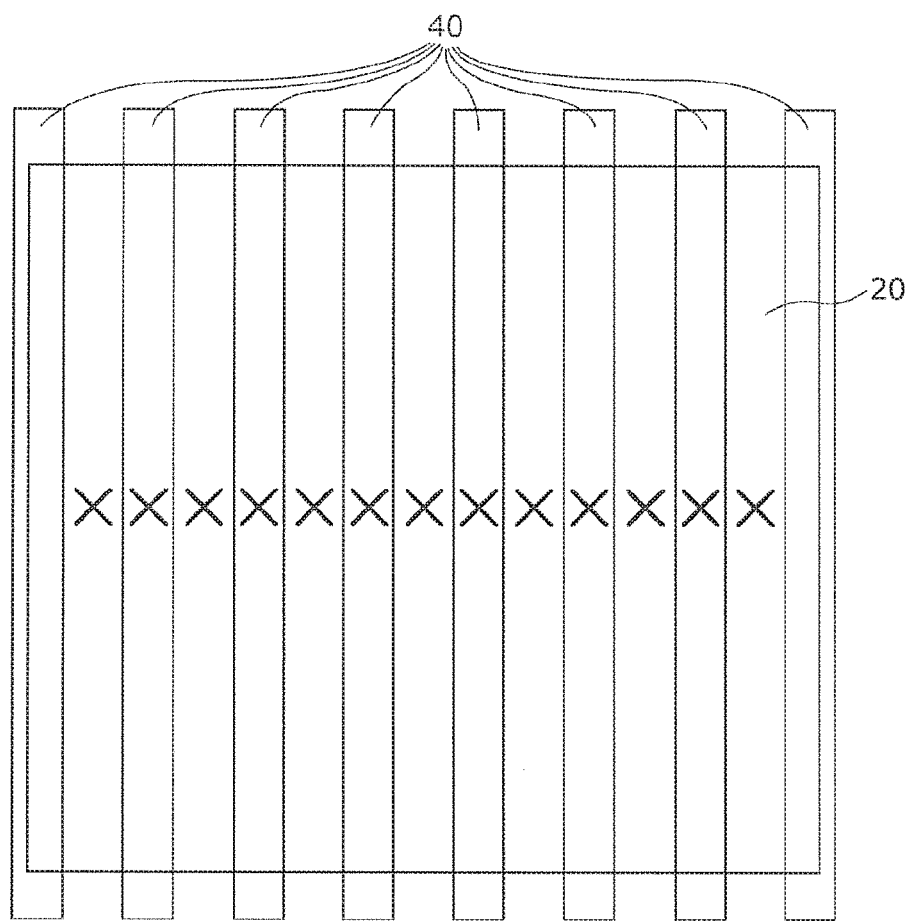
FIG. 8A is a diagram illustrating an example of positioning a measurement position, which depends on a position of sputtering target.
Figure 8B:
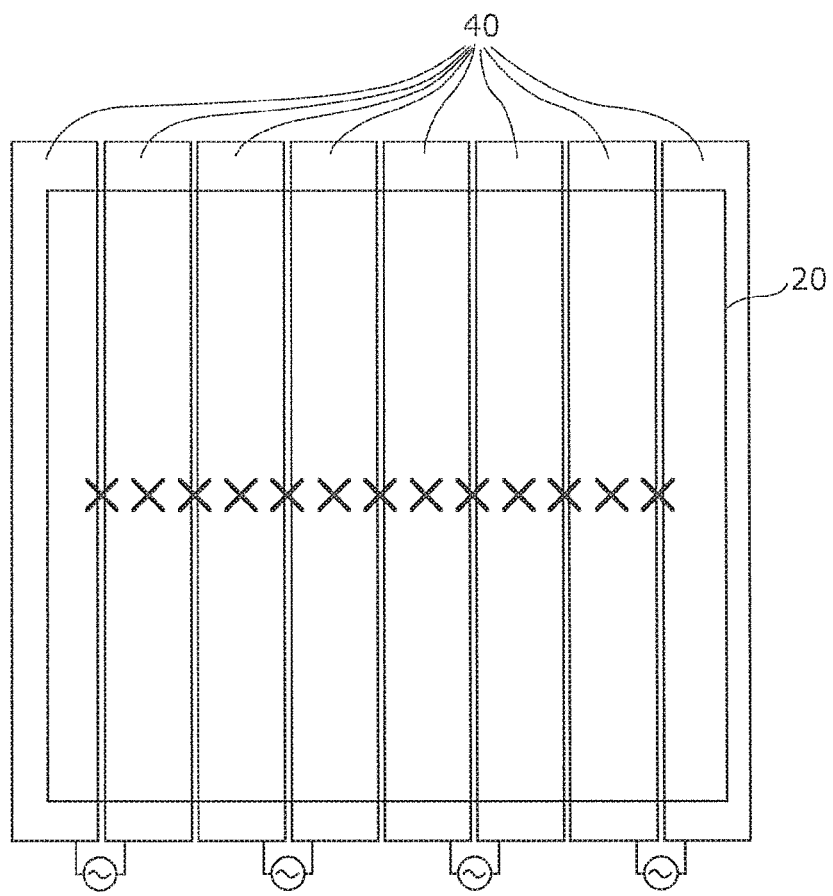
FIG. 8B is a diagram illustrating another example of positioning a measurement position, which depends on a position of sputtering target.

(1) An Example of Positioning a Measurement Position, which Depends on a Position of a Sputtering Target FIG. 8A and FIG. 8B are diagrams each illustrating an example of target positions of measurement using the microwave photoconductivity decay method according to the present embodiment, and in particular an example of positioning a measurement position, which depends on a position of a sputtering target for depositing an oxide semiconductor layer. FIG. 8A and FIG. 8B each illustrate a position of the panel 20 (or the substrate 30), positions of targets (oxide semiconductor sputtering targets 40) of the sputtering method in the depositing step S12 of the oxide semiconductor layer illustrated in FIG. 2, and measurement positions which are sequentially switched (positions indicated by X). It should be noted that FIG. 8A illustrates an example of measurement positions in the case where the sputtering target is a cylindrical target, and FIG. 8B illustrates an example of measurement positions in the case where the sputtering target is a planar target.

As described above, the oxide semiconductor layer is formed by a sputtering method which targets a plurality of strip regions arranged at regular intervals on the substrate 30. Accordingly, in the positioning step S30, the target position of measurement using the microwave photoconductivity decay method is sequentially changed such that measurement, calculation of a parameter, and determination (steps S31 to S33 in FIG. 5) are performed on each of the plurality of strip regions and each of the regions between adjacent strip regions among the plurality of strip regions. With this, it is possible to evaluate a change, variation, etc., in electrical characteristics of the oxide semiconductor layer, which depends on a position of the sputtering target.

(2) An Example of Positioning a Measurement Position, which Depends on a Film Thickness and/or Film Quality of the Oxide Semiconductor Layer FIG. 9A is a diagram illustrating an example of a target position of measurement using the microwave photoconductivity decay method according to the present embodiment, and in particular an example of positioning a measurement position, which depends on a film thickness and/or film quality of the oxide semiconductor layer. Here, the state (distribution) where a film thickness (or a film quality) of the oxide semiconductor layer gradually changes according to positions, and measurement positions which are sequentially switched (positions indicated by X) are illustrated. In FIG. 9A, a higher concentration in a position indicates that the film thickness of the position is greater (or, the film quality is lower).

In the positioning step S30, as to the region expected to have such a distribution, the target position of measurement using the microwave photoconductivity decay method is sequentially changed such that measurement, calculation of a parameter, and determination (steps S31 to S33 in FIG. 5) are performed on a plurality of target positions which are arranged according to a tendency of at least one of (i) an increasing film thickness of the oxide semiconductor layer, (ii) a decreasing film thickness of the oxide semiconductor layer, (iii) a deteriorating film quality of the oxide semiconductor layer, and (iv) an improving film quality of the oxide semiconductor layer. With this, it is possible to evaluate a change, variation, etc., in electrical characteristics of the oxide semiconductor layer, which depends on a film thickness and/or a film quality of the oxide semiconductor layer.

It should be noted that positioning a measurement positions, which depends on a film thickness and/or film quality of the gate insulating layer, the channel protection layer, or the interlayer insulating layer may be performed in the same manner as the example of positioning a measurement position, which depends on a film thickness and/or film quality of the oxide semiconductor layer described above. With this, it is possible to evaluate a change, variation, etc., in electrical characteristics of the oxide semiconductor layer, which depends on a film thickness and/or a film quality of the gate insulating layer, the channel protection layer, or the interlayer insulating layer.

(3) An Example of Positioning a Measurement Position, which Depends on a Temperature Distribution in an Annealing Treatment.

FIG. 9B is a diagram illustrating an example of a target position of measurement using the microwave photoconductivity decay method according to the present embodiment, and in particular an example of positioning a measurement position, which depends on a temperature distribution in an annealing treatment. Here, a planer temperature distribution of the panel 20 in the annealing processes of S15 and S18 described in FIG. 2, and the measurement positions which are sequentially switched (positions indicated by X) are illustrated. In FIG. 9B, it is indicated that a position with a higher concentration has a higher temperature.

In the positioning step S30, as to the panel 20 expected to have such a temperature distribution, the target position of measurement using the microwave photoconductivity decay method is sequentially changed such that measurement, calculation of a parameter, and determination (steps S31 to S33 in FIG. 5) are performed on a plurality of target positions which are arranged with a tendency of an increasing temperature in the annealing treatment on the thin film transistor or a decreasing temperature in the annealing treatment on the thin film transistor. With this, it is possible to evaluate a change, variation, etc., in electrical characteristics of the oxide semiconductor layer, which depends on the temperature distribution in the annealing treatment.

As described above, with the method of evaluating a thin-film transistor according to the present embodiment, it is possible to evaluate electrical characteristics including a threshold voltage and a resistance value of the oxide semiconductor layer based on a decay period and a peak value of a reflectance of a microwave in a non-contacting manner, targeting not the oxide semiconductor thin-film alone a but the oxide semiconductor TFT including the channel protection layer and further the interlayer insulating layer, and the intermediate thereof. It is therefore possible to evaluate an oxide semiconductor TFT by incorporating the measurement using the microwave photoconductivity decay method into manufacturing processes of the oxide semiconductor TFT (i.e., high-volume manufacturing processes of panels), allowing manufacturing and quality control of the oxide semiconductor TFT to be performed in parallel.

Although a method of evaluating a thin-film transistor, a method of manufacturing a thin-film transistor, and a thin-film transistor according to the present disclosure have been described based on the embodiment, the present disclosure is not limited to such embodiment. Other forms in which various modifications apparent to those skilled in the art are applied to the embodiment, or forms structured by combining elements of different embodiments are included within the scope of the present disclosure, unless such changes and modifications depart from the scope of the present disclosure.

For example, the measurement timing in manufacturing of a thin-film transistor is not limited to the timings illustrated in FIG. 2, and it is sufficient to perform the measurement using the microwave photoconductivity decay method at least once after the oxide semiconductor layer is deposited. It is possible to evaluate quality variations in the oxide semiconductor layer, a difference in quality from another panels, and the like, which depends on a planar position in the panel 20, by performing the measurement at least once in the manufacturing processes.

In addition, although a threshold voltage and a resistance value are determined as a method of evaluating a TFT in the above-described embodiment, other characteristics such as a carrier mobility, an S value (subthreshold characteristics), and a fitting parameter when representing a decay curve of a reflectance as a fitted curve may be calculated and determined together with the determining of the threshold voltage and the resistance value.

INDUSTRIAL APPLICABILITY

The present disclosure can be used as a method of evaluating a TFT including an oxide semiconductor layer and a method of manufacturing the TFT, and for example, as a TFT non-contact evaluation method using the microwave photoconductivity decay method incorporated into high-volume manufacturing processes of display panels.

REFERENCE SIGNS LIST 10 measuring device
11 pulse laser
12 microwave oscillator
13 waveguide assembly
14 mixer
15 signal processing device
16 computer
17 stage controller
18 XY stage
20 panel
20a electrode forming region
20b electrode non-forming region
21 TFT
30 substrate
31 gate electrode
32 gate insulating layer
33 oxide semiconductor layer
34 channel protection layer
35a source electrode
35b drain electrode
36 interlayer insulating layer
40 oxide semiconductor sputtering target

The invention claimed is:

1. A method performed by a measuring device for evaluating a thin-film transistor which is disposed on a substrate, and includes at least: an oxide semiconductor layer which functions as a channel layer; and a channel protection layer disposed above the oxide semiconductor layer, the measuring device including a pulse laser that emits pulsed light, a microwave oscillator that outputs a microwave, a waveguide assembly, and a signal processing device, the method comprising:
    measuring a change in a reflectance of the microwave emitted to the oxide semiconductor layer while the oxide semiconductor layer is irradiated with excitation light by pulse irradiation;
    calculating a decay period which is a period of time taken for the reflectance to decay from a first value to a second value, based on the change in the reflectance obtained in the measuring; and
    performing determination related to a threshold voltage of the oxide semiconductor layer, based on the decay period calculated in the calculating.

2. The method of evaluating the thin-film transistor according to claim 1, wherein
    the decay period comprises at least one of
    a period of time taken for the reflectance to decay from a peak value to 1/e of the peak value,
    a period of time taken for the reflectance to decay from 1/e of the peak value to $1/e^2$ of the peak value, or
    a period of time taken for the reflectance to decay from the peak value to $1/e^2$ of the peak value, e being a base of natural logarithm.

3. The method of evaluating the thin-film transistor according to claim 1, wherein
    the determination related to the threshold voltage comprises at least one of identification of the threshold voltage, or determination of whether or not the threshold voltage falls within a predetermined range.

4. The method of evaluating the thin-film transistor according to claim 1, wherein
    in the performing of determination, the threshold voltage of the oxide semiconductor layer corresponding to the decay period calculated in the calculating is identified by referring to a pre-calculated relation between a decay period and a threshold voltage.

5. A method performed by a measuring device for evaluating a thin-film transistor which is disposed on a substrate, and includes at least: an oxide semiconductor layer which functions as a channel layer; and a channel protection layer disposed above the oxide semiconductor layer, the measuring device including a pulse laser that emits pulsed light, a microwave oscillator that outputs a microwave, a waveguide assembly, and a signal processing device, the method comprising:

measuring a change in a reflectance of the microwave emitted to the oxide semiconductor layer while the oxide semiconductor layer is irradiated with excitation light by pulse irradiation;

calculating at least one of a decay period which is a period of time taken for the reflectance to decay from a first value to a second value, or a peak value of the reflectance, based on the change in the reflectance obtained in the measuring; and performing determination related to a resistance value of the oxide semiconductor layer, based on the decay period or the peak value calculated in the calculating.

6. The method of evaluating the thin-film transistor according to claim 5, wherein the decay period comprises at least one of a period of time taken for the reflectance to decay from a peak value to 1/e of the peak value, a period of time taken for the reflectance to decay from 1/e of the peak value to $1/e^2$ of the peak value, or a period of time required for the reflectance to decay from the peak value to $1/e^2$ of the peak value, e being a base of natural logarithm.

7. The method of evaluating the thin-film transistor according to claim 5, wherein the determination related to the resistance value is at least one of identification of the resistance value, or determination of whether or not the resistance value falls within a predetermined range.

8. The method of evaluating the thin-film transistor according to claim 6, wherein in the performing of determination, the resistance value of the oxide semiconductor layer corresponding to the at least one of the decay period or the peak value calculated in the calculating is identified by referring to a pre-calculated relation between a decay period or peak value and a resistance value.

9. The method of evaluating the thin-film transistor according to claim 1, wherein the thin-film transistor is subjected to a first annealing treatment after forming of the channel protection layer, the first annealing treatment being for stabilizing the channel protection layer, and the measuring is performed subsequent to the first annealing treatment.

10. The method of evaluating the thin-film transistor according to claim 1, wherein the thin-film transistor further includes a source electrode and a drain electrode which are disposed above the channel protection layer, and an interlayer insulating layer disposed above the source electrode and the drain electrode, and the measuring is performed after forming of the interlayer insulating layer.

11. The method of evaluating the thin-film transistor according to claim 10, wherein the thin-film transistor is subjected to a second annealing treatment after forming of the interlayer insulating layer, the second annealing treatment being for stabilizing the interlayer insulating layer, and the measuring is performed subsequent to the second annealing treatment.

12. The method of evaluating the thin-film transistor according to claim 1, further comprising positioning a measurement position to change a target position of the measurement performed in the measuring, wherein the measuring, the calculating, and the performing of determination are performed on the target position changed in the positioning.

13. The method of evaluating the thin-film transistor according to claim 12, wherein the oxide semiconductor layer is formed by a sputtering method targeting a plurality of strip regions arranged at regular intervals on the substrate, and in the positioning, the target position of the measurement is changed to perform the measurement in the measuring on each of the plurality of strip regions and each of regions between adjacent ones of the strip regions.

14. The method of evaluating the thin-film transistor according to claim 12, wherein the target position of measurement comprises a plurality of target positions of measurement, and the target position is sequentially changed among the plurality of target positions in the positioning, the plurality of target positions being arranged according to a tendency of at least one of (i) an increasing film thickness of the oxide semiconductor layer, (ii) a decreasing film thickness of the oxide semiconductor layer, (iii) a deteriorating film quality of the oxide semiconductor layer, or (iv) an improving film quality of the oxide semiconductor layer.

15. The method of evaluating the thin-film transistor according to claim 12, wherein the target position of measurement comprises a plurality of target positions of measurement, and the target position is sequentially changed among the plurality of target positions in the positioning, the plurality of target positions being arranged according to a tendency of at least one of (i) an increasing temperature in an annealing treatment performed on the thin-film transistor or (ii) a decreasing temperature in the annealing treatment.

16. The method of evaluating the thin-film transistor according to claim 1, wherein the microwave has a frequency of 10 GHz or higher.

17. The method of evaluating the thin-film transistor according to claim 1, wherein the excitation light has a wavelength of 500 nm or shorter.

18. A method of manufacturing a thin-film transistor, comprising:

forming the oxide semiconductor layer above the substrate, the oxide semiconductor layer functioning as the channel layer;

forming the channel protection layer above the oxide semiconductor layer; and performing the method of evaluating the thin-film transistor according to claim 1.

19. A thin-film transistor formed on a substrate, comprising:

the oxide semiconductor layer which functions as the channel layer; and the channel protection layer formed above the oxide semiconductor layer, wherein the threshold voltage ranges from 1.5 V to 1.9 V or a resistance value ranges from $10^9$ to $10^{11}\Omega$, the threshold voltage and the resistance value being identified using the method of evaluating the thin-film transistor according to claim 1.

* * * * *